United States Patent [19]

Stevenson

[11] Patent Number: 4,552,626

[45] Date of Patent: Nov. 12, 1985

[54] METAL PLATING OF POLYAMIDE THERMOPLASTICS

[75] Inventor: Richard M. Stevenson, Grosse Pointe Woods, Mich.

[73] Assignee: Michael Landney, Jr., Grosse Pointe Shores, Mich.

[21] Appl. No.: 673,185

[22] Filed: Nov. 19, 1984

[51] Int. Cl.$^4$ ................................................. C25D 5/56
[52] U.S. Cl. ........................................ 204/20; 204/30; 204/38.4
[58] Field of Search ............................ 204/20, 38.4, 30

[56] References Cited

U.S. PATENT DOCUMENTS

| | | | |
|---|---|---|---|
| 3,466,232 | 9/1969 | Francis | 204/20 |
| 3,544,432 | 12/1970 | Ishii | 204/20 |
| 3,579,428 | 5/1971 | Kuroda | 204/20 |
| 3,767,538 | 10/1973 | Politycki | 204/30 |
| 3,793,159 | 2/1974 | Wells | 204/20 |
| 4,298,424 | 11/1981 | Terada | 204/20 |

*Primary Examiner*—T. M. Tufariello
*Attorney, Agent, or Firm*—Barnes, Kisselle, Raisch, Choate, Whittemore & Hulbert

[57] ABSTRACT

A process for metal plating filled thermoplastic resins such as nylon-6. The filled resin surface to be plated is cleaned and rendered hydrophillic and preferably deglazed by a suitable solvent or acid. At least a portion of the filler in the surface is removed, preferably by a suitable acid. The treated surface is electroless plated to provide an electrically conductive metal deposit. Thereafter, the electroless plated surface is cleaned and thoroughly dried. The cleaned and dried electroless plated surface is then electroplated with at least one metallic layer to provide a desired wear resistant and/or decorative metallic surface.

16 Claims, No Drawings

METAL PLATING OF POLYAMIDE THERMOPLASTICS

BACKGROUND

This invention relates to the plating with metal of a surface of a filled polyamide thermoplastic such as nylon-6.

In the automotive, home appliance, electronic, container and many other industries there is a great demand for functional and/or decorative metal plating of filled thermoplastic articles. Typically these articles are electroplated with copper, nickel, chromium, and combinations thereof to provide a functional and/or decorative metallic surface. To enable electroplating, the plastic surface must be treated to make it electrically conductive and to promote adhesion to it of electrodeposited metal. To promote adhesion the surface is usually roughened either by mechanical abrasion or chemical etching. The surface is made electrically conductive by electroless plating of copper, nickel, or other conductive metals.

U.S. Pat. No. 4,349,421 discloses a method of plating a polyamide thermoplastic filled with very fine particles of wollastonite such as nylon-6. To promote adhesion, a portion of the filler particles in the surface are dissolved and removed by a dilute acid such as hydrochloric acid. The dilute acid does not attack or etch the nylon resin, but rather only removes a portion of the filler to produce a roughened surface. The roughened surface is made electrically conductive by conventional electroless plating with copper or nickel. Thereafter, the desired metal surface is produced by conventional electroplating of copper, nickel and chromium on the conductive surface.

According to this patent, electroplated filled particles produced by this process have an adhesion or peel strength of about 3 to 6 pounds per linear inch. However, in practice the results of this process are erratic and inconsistent, and consistent adhesion has not been obtained with this process. For no apparent reason adhesion to electroplated nylon-6 articles has varied from almost zero to more than six pounds per linear inch. Moreover, articles chrome plated by this process frequently have visually observable and aesthetically unacceptable streaks or variations in the color, appearance and reflectivity of the finished plated surface.

SUMMARY

Pursuant to this invention, surfaces of articles of filled polyamide thermoplastics can be metal plated by thoroughly cleaning the surfaces, preferably, but not necessarily, deglazing the resin of the surfaces, attacking and removing by an acid the filler in the surfaces, electroless plating and surfaces, cleaning and drying the electroless plated surfaces, and electroplating the surfaces. To improve adhesion, initially the plastic surface is thoroughly cleaned and made hydrophillic, preferably by application of an alkaline detergent cleaner with a surfactant. To further improve adhesion, after cleaning, preferably the plastic resin is deglazed or softened by contact with an acid and/or a suitable conditioner which tends to soften or have a solvent or partial dissolution action on the resin.

To assure adhesion, the filler is removed from the cleaned surface by contacting it with a dilute acid solution. If the plastic resin is to be deglazed by an acid such as formic or acetic acid it is preferably added to this solution. This enables both the deglazing of the resin and the removal of the filler at the same time.

Preferably, but not necessarily, to further improve adhesion and insure penetration of an activator and catalyst for electroless plating, the surface can be cleaned and dried. Both the treated resin and any exposed filler tend to retain substantial moisture which is believed to be somewhat detrimental to adhesion and hence, preferably should be removed such as by thorough drying. Preferably the surface is cleaned by washing in water and dried by forced hot air to remove all moisture.

The surface is electrolessly plated to provide an electrically conductive metal film. To consistently provide adequate adhesion and eliminate streaking or staining of the finished surface, the electroless plated surface must be dried before electroplating. Preferably the electroless plated surface is cleaned by washing in water and then dried by forced hot air to remove all moisture. The dried surface is then electroplated with one or more metal layers to provide the desired functional and/or decorative metal finish. This electroless plating and electroplating can be accomplished by conventional techniques known to skilled persons.

Some of the objects, features and advantages of this invention are to provide a metal plating process and article for polyamide thermoplastics which reliably, repeatedly and consistently has adequate adhesion of the plated metal, has improved adhesion strength, abrasion resistance, brightness, surface finish and appearance of the plated metal, virtually eliminates streaking, pitting, blistering, crazing, and cracking of the plated metal, and is economical and easily and readily implemented in mass production operations.

These and other objects, features, and advantages of this invention will be apparent from the appended claims and the following detailed description.

DETAILED DESCRIPTION

I. Thermoplastics

A variety of thermoplastics may be metal plated with this invention including random, block and graft thermoplastics having ester, carbonate, and/or amide linkages or combinations thereof with a weight average molecular weight of at least about 10,000. Examples of these thermoplastics are polyesters such as polyethylene terephthalate, polybutylene terephthalate and polycarbonates, ethylene acrylic acid copolymer and its esters, ethylene maleic acid copolymer and its esters, styrene containing ester, carbonate or amide groups, any of these polymers which also have at least one halogen group other than astatine, and polyamides.

Suitable polyamides include the long chain polymeric amides having recurring amide groups as part of the polymer backbone and preferably a number average molecular weight of about 15,000 to 40,000. Examples of these polyamides are those prepared by the polymerization of lactams, preferably epsilon-caprolactam (nylon-6); those prepared by the condensation of a diamine with a dibasic acid, preferably the condensation of hexamethylene diamine with adipic acid (nylon-6,6) or with sebacic acid (nylon-6,10); those prepared by self-condensation of amino acids, preferably self-condensation of 11-aminoundecanoic acid (nylon 11); and those based on polymerized vegetable oil acids, or random, block or graft interpolymers consisting of two or more of these polymers. Preferred polyamides are polyepsiloncaprolactam, polyhexamethylene adipamide, and a copolymer of polyepsiloncaprolactam and polyhexamethylene adipamide.

Also believed to be suitable are polyamide interpolymers comprising a polyamide and one or more comonomers. Examples are acrylic or methacrylic acid and/or their derivatives, such as acrylonitrile, acrylamide, methyl, ethyl, propyl, butyl, 2-ethylhexyl, decyl and tridecyl esters of acrylic or methacrylic acid, vinyl esters such as vinyl acetate and vinyl propionate; vinyl aromatic compounds such as styrene, a-methylstyrene, and vinyl toluenes and vinyl ethers such as vinyl isobutyl ether.

These polyamides with various terminal functionality are also suitable. Preferred are the polycaprolactams (nyon-6) containing, a carboxyl group attached to both ends of the polymer chain, a carboxyl group attached to one end and an acetamide group attached to the other end, an amino group attached to both ends, and a carboxyl group attached to one end and an amino group attached to the other end.

II. Fillers

Suitable fillers for the thermoplastic are metal salts and minerals having an average particle size of not more than about 3.5 microns and preferably about 2.5 to 3.5 microns with 95% by number of the particles having a length not greater than about 10 microns. Usually the filler is about 5 to 60% and preferably about 30 to 45% by weight of the combined thermoplastic and filler. When combined with the thermoplastic and formed into an article the salts and minerals on the surface of the article to be plated must be susceptible to attack and at least partial dissolution and removal by a dilute acid. Furthermore, the fillers must not attack and degrade the thermoplastic resin.

Suitable fillers include the metal carbonates where the metal is selected from the group consisting of barium, bismuth, cadmium, calcium, cobalt, copper, lead, magnesium, iron, nickel and zinc; the metal oxides where the metal is selected from the group consisting of aluminum, antimony, bismuth, cadmium, cerium, cobalt, copper gaillium, garnianium,, indium, iron, lead manganese, nickel, tin, zinc and zirconium; the metal hydroxides where the metal is selected from the group consisting of bismuth, cerium, cobalt, copper and manganese; the metal oxalates where the metal is selected from the group consisting of aluminum, calcium, cobalt, iron, lead, magnesium manganese, nickel and tin; the metal orthophosphates where the metal is selected from the group consisting of aluminum, cadmium, cerium, chromium, cobalt, lead, lithium, magnesium, nickel, strontium, tin and zinc; the metal metasilicates where the metal is selected from the group consisting of barium, calcium, lead and lithium; and the metal pyrophosphates where the metal is selected from the group consisting of magnesium, manganese and nickel.

Suitable mineral fillers are calcium aluminate, calcium metaborate, calcium molybdate, calcium metatungstate, sodium aluminate, sodium potassium aluminate, and sodium aluminum silicate. Metal powders such as cerium, aluminum, zinc, tin and magnesium are also acceptable fillers.

The metasilicates are preferred fillers and the most preferred metasilicate is calcium metasilicate which is commonly referred to as wollastonite.

III. Resin and Filler Blend

The filler and thermoplastic resin can be blended by conventional processes and equipment either before or when extruded and molded to produce an article to be plated. Before blending the filler is preferably treated with coupling agents such as organosilane compounds, titanate compounds and the like to promote bonding between the filler and resin.

A preferred molding composition is believed to be filled nylon-6 commercially available from Allied Chemical Corp. of Morristown, New Jersey under the tradename Capron Nylon CPN-1030 and CPN-8260. This molding composition is believed to be about 50% by weight Poly [imino (1-oxo-1,6hexanediyl)] $(C_6H_{11}NO)_n$ [25038-56-5], about 50% by weight of wollastonite [10101-39-0] filler, and a catalytic quantity of an organosilane coupling compound such as (-aminopropyl trimethoxy silane) [13822-56-5] $C_9H_{23}NO_3Si$ or (-aminopropyl triethoxy silane) [13822-56-5] $C_6H_{17}NO_3Si$.

IV. Cleaning The Articles

To ensure adhesion of the metal, the surface of the article to be plated must be thoroughly cleaned and made hydrophillic before treatment to deglaze the resin and/or remove the filler from the surface. Grease, mold release agents, dirt and even fingerprints must be removed from the surface. An alkaline cleaning solution with surfactants, chelators, and dispersants is satisfactory. Anionic, cationic and nonionic surfactants have all improved adhesion of the plated metal to the plastic surface. A preferred anionic surfactant is commercially available from 3M Company under the tradename Fluorad Surfactant FC 99, which is believed to be an amine salt of a perfluoro alkyl sulfonic acid. Typically the surfactant is about less than 1% to 5% by weight of the cleaning solution and usually about 0.5%.

The purpose of the chelators is to absorb the various elements and compounds typically found in hard water such as calcium, magnesium and the like. Suitable chelators are Ethylene diamine tetracetic acid, Nitrillo triacetic acid, Ethylene diamine tetrapropanol, N-hydroxyethyl ethylene diamine triacetic acid and their water soluble salts which are usually sodium. Typically, the chelators are about less than 1% to 5% by weight of the cleaning solution and usually about 0.5%. The purpose of the dispersants is to keep in solution or suspension the dirt, soil, grease and the like removed from the articles. Suitable dispersants are surfactants, wetters, sequestering agents and emulsifiers. Typically, the dispersants are about less than 1% to 5% by weight of the cleaning solution and usually about 0.5.

A preferred cleaning solution is an alkaline soak cleaner commercially available from Enthone Inc. of P.O. Box 1900, New Haven, CT 06508 under the tradename Enplate PZ-454. Preferably the articles are cleaned by immersing them for about 3 to 10 minutes in a bath of this cleaning solution which is preferably at an operating temperature of about 110° to 140° F. After cleaning, preferably the articles are rinsed in fresh water, such as by immersion, to remove the cleaning solution. V. Deglaze Resin Of The Surface Preferably, although not necessarily, to improve adhesion, the resin of the surface of the article to be plated is deglazed. The resin can be deglazed by treating it with a suitable acid or an organic solvent. Contacting the resin surface with an undiluted organic solvent or even a diluted organic solvent for an excessive amount of time results in gelling and even running of the resin. Therefore, the organic solvents are diluted with an inert liquid, and the duration of the contact of the resin with the diluted solvent and the temperature of the diluted solvent are controlled so that the resin surface is deglazed without gelling or running. In practice this usually requires varying or adjusting the solvent concentration, duration of contact and temperature to achieve the optimum deglazing results for a particular filled resin and solvent solution.

Suitable organic solvents, concentrations in an aqueous solution, duration of immersion in the solution, and temperature of the solution for deglazing the resin surface are set forth in Table I.

TABLE I

| Solvent | Concentration By Vol. in % | Immersion Time In Seconds | Temperature In °F. |
|---|---|---|---|
| Acetone | 35–65 | 15–45 | 80–130 |
| Butyrolactone | 1–10 | 15–60 | 80–130 |
| Diacetylmethane | 10–20 | 15–60 | 115–165 |
| Furfuryl Alcohol | 20–50 | 30–100 | 80–130 |
| Methyl Ethyl Ketone | 15–50 | 240–360 | 65–110 |
| N—Methyl Pyrrolidone | 5–10 | 15–40 | 110–165 |
| 1,3 Dioxolane | 15–30 | 15–45 | 60–100 |
| p-Dioxane | 70–90 | 20–50 | 80–130 |
| Propylene Carbonate | 5–30 | 15–60 | 80–130 |

The presently preferred solvent bath for deglazing the resin of the surface is an aqueous solution of about 18–20% by volume of propylene carbonate and about 3–4% by volume of butyrolactone. Articles to be deglazed are immersed in this solvent bath for about 5 to 35 seconds with the bath at an operating temperature of about 80° to 100° F. Preferably, after deglazing in a solvent the article is rinsed in fresh water to remove the residue of the solvent before further processing of the article to remove the filler from the deglazed surface of the article.

Instead of deglazing with a solvent bath, the resin can be deglazed or micro etched by treatment with a suitable solution of acid or acids. Preferably, the articles are etched by immersion for 3 to 10 minutes in a suitable acid bath at an operating temperature of 60° to 110° F. Suitable acids for micro etching and their concentration in an aqueous solution are set forth in Table II.

TABLE II

| Acid | Concentration In % by Volume |
|---|---|
| Acetic Acid | 60–100 |
| Formic acid | 25–50 |
| Propionic acid | 90–100 |
| P-toluene sulfonic or tosic acid | 10–40 |
| Mixture of equal portions by volume of chromic, sulfuric & phosphoric acids | 25–35 |

Preferably the plastic is deglazed by contact with an acid rather than an organic solvent. It is presently preferred to deglaze the plastic by immersion for about 3 to 10 minutes in an aqueous bath of 15 to 30% by volume of tosic acid at a temperature of 70° to 80° F. Tosic acid is believed both to provide the most uniform deglazing of the plastic and to stress relieve the deglazed surface which improves the useful service life and appearance of the metal plated surface.

Preferably, although not necessarily, this acid is part of the bath used to remove the filler from the surface of the plastic and hence deglazing is carried out simultaneously with removal of the filler as discussed below. Deglazing while also removing the filler simplifies and decreases the number of steps needed to carry out the process.

V. Removal of Filler From the Resin Surface

The mineral filler can be removed from the resin surface by contact with a suitable organic or mineral acid which will dissolve and remove the filler. Acids having a normality of less than about 4.0 and preferably about 1.0 to 3.0 are generally satisfactory. Preferably, the articles are immersed in a suitable acid bath at an operating temperature of about 60° to 110° F. Suitable acids, their concentration in water, and immersion time are set forth in Table III.

TABLE III

| Acid | Concentration In % By Vol. | Immersion Time In Minutes |
|---|---|---|
| Acetic | 65–85 | 3–10 |
| Chromic [CrO₃] | 2–4 | 3–10 |
| Citric | 90–100 | 3–10 |
| Formic acid | 40–60 | 3–10 |
| Glycolic acid | 80–100 | 3–10 |
| Hydrobromic (40%) | 15–25 | 3–10 |
| Hydrochloric | 10–60 | 3–10 |
| Hydrofluoric | 2.5–10 | 1–5 |
| Lactic | 90–100 | 3–10 |
| Nitric | 20–40 | 3–10 |
| Oxalic acid | 40–60 | 3–10 |
| Phosphoric | 7–13 | 3–10 |
| Propionic | 90–100 | 3–10 |
| Sulfuric | 10–20 | 3–10 |
| Toluene Sulfonic | 10–40 | 3–10 |

If the filler in the resin has a siliceous composition, such as wollastonite which is chiefly calcium metasilicate [CaO SiO$_2$], preferably a hydrofluoric acid bath is used to remove the filler because this acid attacks the siliceous composition, as well as the calcium, and hence, provides a more uniform removal of the filler. Preferably the filled resin is immersed for about 3 to 4 minutes in an aqueous bath having a concentration of about 6 to 7% by volume of one normal hydrofluoric acid at an operating temperature of about 60° to 100°F. To simultaneously deglaze the resin, preferably this bath also contains a suitable acid or solvent such as about 18 to 25% by volume of 96% p-toluene sulfonic acid.

VII. Cleaning The Treated Resin Surface

Preferably, although not necessarily, to obtain improved adhesinon of the electroplated metal, the treated resin surface should be cleaned and dried before electroless plating. Preferably, the treated surface is cleaned by washing it in tap water, preferably several times, and then in distilled or deionized water. Preferably, the resin surface is cleaned by immersion in baths of tap and deionized water for at least about 10 to 60 seconds at an operating temperature in the range of about 60° to 120° F.

VIII. Drying The Treated Resin Surface

The treated resin surface retains considerable moisture which preferably, although not necessarily, should be removed such as by drying before applying a catalyst for electroless plating to provide improved adhesion of the electroplated metal to the surface of the resin. Preferably, the cleaned and treated resin surface is dried in a forced air oven with filtered air heated to a temperature of about 130° to 190° F. Usually the resin surface is exposed to the forced hot air in the oven for about 15 to 30 minutes.

IX. Electroless Plating Of The Resin Surface

To enable metallic electroplating, an electrically conductive metallic layer is deposited on the treated, and preferably cleaned and dried, resin surface of the article. The electrically conductive metallic layer can be deposited by conventional electroless plating techniques. Preferably, the surface is electroless plated by tin-palladium transfer techniques in which the surface is sensitized, activated or catalyzed, and then contacted with a metallic salt solution to deposit elemental metal by chemical reduction.

Preferably the resin surface is sensitized by immersion in an acid bath of stannous chloride, stannous fluoborate or stannous sulfate and preferably stannous chloride. The sensitized surface is then washed or rinsed in tap water to remove excess stannous ions and to prevent contamination of the activator. Preferably, the sensitized surface is activated or catalyzed by immersion in an acid bath of silver nitrate or preferably palladium chloride. The activated surface is then washed or rinsed to remove excess catalyst and to prevent contamination of the electroless plating bath.

Preferably, the catalyzed surface is electroless plated by immersion in a bath of a cobalt or preferably nickel or copper salt solution. By chemical reduction elemental metal from the bath forms a complex bond through the tin and palladium to the treated resin surface.

The presently preferred compositions and operating conditions of the aqueous baths for electroless plating are set forth in Table IV.

XI. Drying The Electroless Plated Surface

The electroless plated surface retains considerable moisture which must be removed before electroplating, such as by drying, to provide consistent adhesion and improved adhesion strength of the electroplated metal to the surface of the resin. Preferably, the electroless plated surface is dried in a forced air oven with filtered air heated to a temperature of about 130° to 190° F. Usually the electroless plated surface is exposed to the forced hot air in the oven for about 15 to 30 minutes.

XII. Electroplating

The electroless plated resin surface is then electroplated to provide a metallic finish. Preferably, the surface is electroplated with copper followed by nickel or chromium or with nickel followed by chromium. The surface can be electroplated by conventional techniques. The thickness of the electroplated coating is generally in the range of about 0.1 to 10 mills, usually about 0.3 to 6 mills and preferably about 0.8 to 2 mills.

To improve resistance to thermal shock, preferably the surface is first electroplated with a layer of ductile copper. The total thickness of copper is then built up by applying one or more layers of bright copper. For improved resistance to thermal shock, it is usually desirable that the total copper thickness be at least three times the total thickness of the nickel or nickel and chromium layers. To provide improved corrosion resis-

TABLE IV

| Bath | Composition & Source | Concentration | Immersion Time In Minutes | Temp. In °F. |
|---|---|---|---|---|
| Sensitizer | Catalyst 9F Shipley Co. Inc. 2300 Washington St. Newton, MA 02162 | 8-10 gms. per liter | 5-7 | 65-85° |
| Activator | Accelerator PA-492 Enthone Inc. P.O. Box 1900 New Haven, CT 06508 | 4% by vol | 1-2 | 110-125° |
| Electroless Copper | Udique 820A Udique 820B Udique 820E Udique 820H Udylite Corp. 21441 Hoover Rd. Warren, MI 48089 | 1.3% by vol 8% by vol .05% by vol .12% by vol | 5-10 | 135-145° |
| Electroless Nickel | N-35-1 N-35-2 N-35-3 Borg Warner Co. International Center Parkersburg, WV 26101 | 10% by vol 8% by vol 2.5% by vol | 5-10 | 60-90° |

X. Cleaning The Electroless Plated Surface

To obtain consistent adhesion and improved strength of adhesion of the electroplated metal, the electroless plated resin surface should be cleaned and must be dried before electroplating. Preferably, the treated surface is cleaned by washing it in tap water, preferably several times, and then in distilled or deionized water. Preferably, the electroless plated surface is cleaned by immersion in baths of tap and deionized water for at least about 10 to 60 seconds at an operating tempeature in the range of about 60° to 120° F.

tance and a truer color of any chromium layer, a nickel layer is usually deposited on the copper. To provide abrasion resistance and a brilliant and decorative finish a layer of layers of chromium are deposited.

Presently preferred aqueous baths and operating conditions for electroplating are set forth is Table V. Preferably, to prevent contamination the resin surface is washed or rinsed between each bath such as by immersion in a fresh water bath at room temperature which is preferably agitated.

TABLE V

| Bath | Constituents & Source | Concentration | Conditions |
|---|---|---|---|
| Ductile Copper Strike | $CuSO_4$ $H_2SO_4$ HCl Brightener-Besbon AC-363 | 10-Oz/Gal 22-30 Oz/Gal 11-13 PPM $Cl^-$ .25-.75% | 70-85° F. 5-80 ASF |

TABLE V-continued

| Bath | Constituents & Source | Concentration | Conditions |
|---|---|---|---|
| | McGean-Rocho 2910 Harvard Ave. Cleveland, Ohio 44109 | | |
| Bright Ductile Copper | $CuSO_4$ $H_2SO_4$ HCl Brightener-UBAC HS Acid Copper Additive SK Udylite Corp 21441 Hoover Road Warren, MI 48089 | 18-24 Oz/Gal 8-12 Oz/Gal 30-90 PPM $Cl^-$ .25-.75% .01-.03% | 75-100° F. 20-80 ASF |
| Semi-Bright Nickel | $NiSO_4$ NiCl Semi-brighteners- Quin-Tec 404 & Quin-Tec 408 Quin-Tec Corp 14057 Stephens Hwy Warren, MI 48089 | 35-50 Oz/Gal 5-6.5 Oz/Gal .03-.05% .1-.3% | 130-150° F. 20-60 ASF |
| Bright Nickel | $NiSO_4$ NiCl Brighteners- Supreme BNA & Supreme ZD-100 Addition Agent Antipit Harshaw Chemical Co 1945 East 97th St. Cleveland, Ohio 44106 | 30-50 Oz/Gal 5-15 Oz/Gal .5-1% 3-5% .005-.01% .01-.05% | 125-150° F. 20-60 ASF |
| Chromium | $CrO_3$ Ultra Chrome 107 Udylite Corp. 21441 Hoover Road Warren, MI 48089 | 48-51 Oz/Gal .25-.75% | 120-125° F. 215-290 ASF |

XIII. Examples

The following examples further illustrate this invention and should not be construed as limiting the scope and breadth of this invention as defined by the appended claims.

EXAMPLE I

A plurality of flat plates of filled nylon-6 plastic were metal plated in accordance with this invention by the following steps and under the specified operating condidtions.

| Step | Bath And Concentration | Temp. | Time in Minutes | ASF |
|---|---|---|---|---|
| Cleaning | 5% Enplate PZ-454 Soak Cleaner | 130° F. | 6 | |
| Acid Rinse | .3% $H_2SO_4$ | 75° F. | 1 | |
| Deglaze & Remove Filler | 20% Tosic Acid | 75° F. | 5 | |
| Rinse | Cold Water | | | |
| Electroless Plating Sensitizer | 9 grams/liter Catalyst 9F of Shipley Co. | 75° F. | 6 | |
| Rinse | Cold Water | | 1 | |
| Accelerator | 4% Enthone PA-492 | 125° F. | 1 | |
| Alkaline Rinse | 5% Caustic Soda | 75° F. | 1 | |
| Rinse | Cold Water | | 1 | |
| Electroless Copper | 1.3% Udique 820A 8% Udique 820B .05% Udique 820E .12% Udique 820H | 135° F. | 10 | |
| Rinse | Cold Water | | 1 | |
| Rinse | Deionized Water | 70° F. | 1 | |
| Remove Moisture | Oven dry with forced hot air | 150° F. | 30 | |
| Electroplate Cleaning | 5% Enplate PZ-454 | 120° F. | 5 | |
| Rinse | Cold Water | | | |
| Acid Rinse | 5% $H_2SO_4$ | 75° F. | ½ | |
| Rinse | Cold Water | | 1 | |
| Ductile Copper Strike | 12 oz/gal $CuSO_4$ 26 oz/gal $H_2SO_4$ 12 ppm $HCl^-$ .5% Besbon AC-363 | 75° F. | 3 | 30 |
| Bright | 21 oz/gal $CuSO_4$ | 75° F. | 30 | 30 |

-continued

| Step | Bath And Concentration | Temp. | Time in Minutes | ASF |
|---|---|---|---|---|
| Copper Plate | 10 oz/gal $H_2SO_4$<br>60 ppm $HCl^-$<br>.5% UBAC HS Acid Copper<br>.02% Additive SK | | | |
| Rinse | Cold Water | | 1 | |
| Acid Rinse | 5% $H_2SO_4$ & 1% $H_2O_2$ | 75° F. | ½ | |
| Rinse | Cold Water | | 1 | |
| Semi-Bright Nickel | 43 oz/gal $NiSO_4$<br>6 oz/gal NiCl<br>.04% Quin-Tec 404<br>.2% Quin-Tec 408 | 140° F. | 30 | 30 |
| Bright Nickel | 40 oz/gal $NiSO_4$<br>10 oz/gal NiCl<br>.8% Supreme BNA<br>4% Supreme ZD-100<br>.008% Addition Agent<br>.03% Antipit | 140° F. | 15 | 30 |
| Rinse | Cold Water | | 1 | |
| Rinse | Cold Water | | 1 | |
| Acid Rinse | .5 oz/gal Chromic Acid | 75° F. | ½ | |
| Chromium Plate | 50 oz/gal $H_2CrO_4$<br>.5% Ultra Chrome 107 | 120° F. | 3 | 215 |
| Rinse | Cold Water | | 1 | |
| Rinse | Deionized Water | 70° F. | 1 | |

Adhesion values of the metal layer on the plated plastic were obtained by pulling the metal layer from the plastic substrate in an Instron tester at a right angle to the substrate at a rate of 2 inches per minute. Each metal layer pulled from the plastic substrate had a width of 1 inch. The metal layers had a pull strength in excess of 25 pounds per linear inch.

EXAMPLE II

A plurality of flat plates is filled nylon-6 plastic were metal plated in accordance with this invention by the following steps and under the specified operating condidtions.

| Step | Bath And Concentration | Temp. | Time in Minutes | ASF |
|---|---|---|---|---|
| Cleaning | 5% Enplate PZ-454 Soak Cleaner | 130° F. | 6 | |
| Deglaze & Remove Filler | 250 ml/L 90% Formic Acid & 80 ml/L 50% Hydrofluoric Acid | 75° F. | 7 | |
| Rinse | Cold Water | | 1 | |
| Electroless Plating Sensitizer | 9 grams/liter Catalyst 9F of Shipley Co. | 75° F. | 5 | |
| Rinse | Cold Water | | 1 | |
| Accelerator | 8% Enthone PA-492 | 125° F. | ½ | |
| Rinse | Cold Water | | 1 | |
| Electroless Copper | 1.3% Udique 820A<br>8% Udique 820B<br>.05% Udique 820E<br>.12% Udique 820H | 140° F. | 10 | |
| Rinse | Cold Water | | 1 | |
| Rinse | Deionized Water | 70° F. | 1 | |
| Remove Moisture | Oven dry with forced hot air | 150° F. | 20 | |

Electroplate
Same steps, baths and operating conditions as in Example I.

Adhesion values of the metal layer on the plated plastic were obtained by pulling the metal layer from the plastic substrate in an Instron tester at a right angle to the substrate at a rate of 2 inches per minute. Each metal layer pulled from the plastic substrate had a width of 1 inch. The metal layers had a pull strength in excess of 20 pounds per linear inch.

EXAMPLE III

A plurality of flat plates of filled nylon-6 plastic were metal plated in accordance with this invention by the following steps and under the specified operating condidtions.

| Step | Bath And Concentration | Temp. | Time in Minutes | ASF |
|---|---|---|---|---|
| Cleaning | 5% Enplate PZ-454 Soak Cleaner | 130° F. | 6 | |
| Deglaze & Remove Filler | 35% $H_2SO_4$ & 15% HCl | 75° F. | 5 | |
| Rinse | Cold Water | | | |
| Rinse | Deionized Water | 70° F. | 1 | |
| Electroless Plating Sensitizer | 9 grams/liter Catalyst 9F of Shipley Co. | 75° F. | 3 | |
| Rinse | Cold Water | | 1 | |
| Accelerator | 8% Enthone PA-492 | 125° F. | ½ | |
| Alkaline Rinse | 5% Caustic Soda | 75° F. | 1 | |
| Rinse | Cold Water | | 1 | |
| Electroless Nickel | 10% N-35-1<br>8% N-35-2<br>2.5% N-35-3 | 80° F. | 10 | |
| Rinse | Cold Water | | 1 | |
| Rinse | Deionized Water | 70° F. | 1 | |
| Remove Moisture | Oven dry with forced hot air | 150° F. | 20 | |

Electroplate
Same steps, baths and operating conditions as in Example I.

Adhesion values of the metal layer on the plated plastic were obtained by pulling the metal layer from the plastic substrate in an Instron tester at a right angle to the substrate at a rate of 2 inches per minute. Each metal layer pulled from the plastic substrate had a width of 1 inch. The metal layers had a pull strength in excess of 15 pounds per linear inch.

EXAMPLE IV

A plurality of flat plates of filled nylon-6 plastic were metal plated in accordance with this invention by the following steps and under the specified operating condidtions.

| Step | Bath And Concentration | Temp. | Time in Minutes | ASF |
|---|---|---|---|---|
| Cleaning | 5% Enplate pZ-454 Soak Cleaner | 130° F. | 6 | |
| Deglaze & Remove Filler | 16% Tosic Acid & 11% H₂SO₄ | 75° F. | 5 | |
| Rinse | Cold Water | | 1 | |
| Electroless Plating Sensitizer | 9 grams/liter Catalyst 9F of Shipley Co. | 75° F. | 5 | |
| Rinse | Cold Water | | 1 | |
| Accelerator | 8% Enthone PA-492 | 125° F. | ½ | |
| Rinse | Cold Water | | 1 | |
| Electroless Copper | 10% Enthone 750 | 80° F. | 10 | |
| Rinse | Cold Water | | 1 | |
| Rinse | Deionized Water | 70° F. | 1 | |
| Remove Moisture | Oven dry with forced hot air | 150° F. | 30 | |

Electroplate
Same steps, baths and operating conditions as in Example I.

Adhesion values of the metal layer on the plated plastic were obtained by pulling the metal layer from the plastic substrate in an Instron tester at a right angle to the substrate at a rate of 2 inches per minute. Each metal layer pulled from the plastic substrate had a width of 1 inch. The metal layers had a pull strength in excess of 20 pounds per linear inch.

These examples illustrate this invention provides consistent and readily duplicated adhesion of metal layers to a thermoplastic resin surface and improved adhesion strength. The resulting plated metal surface has improved brightness, clarity and appearance and is essentially free of pitting, blistering, crazing and streaks or variations in color and appearance observable by the naked eye. Moreover, this process is economical and easily implemented for mass production of metal plated thermoplastic articles.

I claim:

1. A method of metal plating a surface of an article of a thermoplastic resin with a filler therein comprising the steps of; providing an article of at least one of a polyester and polyamide resin with a weight average molecular weight of at least about 10,000 and filled with about 5 to 60% by weight of at least one of metal, metal salt and mineral fillers, cleaning and making hydrophillic a surface of said article by contacting said surface with an alkaline cleaning solution and a surfactant prior to removing filler from said surface, removing at least a portion of the filler from said surface by contacting said surface with an organic or mineral acid having a normality of not greater than about 4.0 and which will dissolve at least a portion of said filler, after removing said filler electroless plating said surface from which filler has been removed to deposit thereon and adhere thereto an electrically conductive metallic layer of at least one of cobalt, nickel and copper, driving said electroless plated surface to remove essentially all moisture therefrom by heating to an elevated temperature of not more than about 190° F. for not more than 30 minutes, after drying said electroless plated surface electroplating such surface to deposit thereon and adhere thereto at least one metallic layer of at least one of copper and nickel, and thereafter electroplating such electroplated surface to deposit on and adhere to said layer at least one layer of at least one of nickel and chromium.

2. The method of claim 1 which also comprises the step of deglazing said surface after making it hydrophillic and before electroless plating thereof by contacting said surface with a diluted solution of at least one organic solvent of the group consisting essentially of acetone, butyrolactone, diacetylmethane, furfuryl alcohol, methyl ethylketone, n methyl pyrrolidone, 1,3 dioxolane, p-dioxane, and propylene carbonate.

3. The method of claim 2 which also comprises carrying out said deglazing step and said filler removal step at the same time by contacting said surface with said filler removal acid and said solvent at the same time.

4. The method of claim 1 which also comprises the step of deglazing said surface after marking it hydrophillic and before electroless plating thereof by contacting said surface with a diluted solution of at least one organic solvent of the group consisting essentially of chloroform, ethyl acetate, methylene chloride, methyl acetate and m-cresol.

5. The method of claim 1 which also comprises the step of deglazing said surface after making it hydrophilic and before electroless plating thereof by contacting said surface with at least one deglazing acid of the group consisting essentially of acetic, acetic anhydride, formic, propionic, and p-toluene sulfonic acids.

6. The method of claim 5 wherein said deglazing acid consists essentially of p-toluene sulfonic acid.

7. The method of claim 5 which also comprises carrying out the filler removal step and the deglazing step at the same time by contacting said surface with said filler removal acid and said deglazing acid at the same time.

8. The method of claim 7 wherein said deglazing acid consists essentially of p-toluene sulfonic acid.

9. The method of claim 8 wherein said filler comprises a siliceous composition and said filler removal acid comprises hydrofluoric acid.

10. The method of claim 1 wherein said filler removal acid is at least one of the group consisting essentially of acetic, chromic, citric, hydrobromic, hydrochloric, hydrofluoric, nitric, phenyl sulfonic, phosphoric, sulfuric, tartaric, and toluene sulfonic acids.

11. The method of claim 1 wherein said filler comprises a siliceous composition and said filler removal acid comprises hydrofluoric acid.

12. The method of claim 1 wherein said step of removing essentially all moisture from said surface before electroplating thereof comprises contacting said surface with forced hot air at a temperature in the range of about 130° to 190° F.

13. The method of claim 1 which also comprises the step of removing essentially all moisture from said surface after removing filler therefrom and before electroless plating thereof by heating to an elevated temperature of not more than about 190° F. for not more than about 30 minutes.

14. The method of claim 13 wherein said step of removing essentially all moisture from said surface after removing filler therefrom comprises contacting said surface with forced hot air at a temperature in the range of about 130° to 190° F.

15. The method of claim 1 which also comprises the steps of cleaning said surface after removing filler therefrom and before electroless plating thereof, and removing essentially all moisture from said surface after cleaning thereof and before electroless plating thereof by heating to an elevated temperature of not more than about 190° F. for not more than about 30 minutes.

16. The method of claim 15 wherein said step of removing essentially all moisture from said surface after cleaning thereof comprises contacting said surface with forced hot air at a temperature in the range of about 130° to 190° F.

* * * * *